(12) United States Patent
Oowada et al.

(10) Patent No.: US 7,816,312 B2
(45) Date of Patent: Oct. 19, 2010

(54) COMPOSITION FOR PHOTORESIST STRIPPING SOLUTION AND PROCESS OF PHOTORESIST STRIPPING

(75) Inventors: Takuo Oowada, Tokyo (JP); Kaoru Ikegami, Saitama (JP)

(73) Assignee: Kanto Kagaku Kabushiki Kaisha, Tokyo (JP)

(*) Notice: Subject to any disclaimer, the term of this patent is extended or adjusted under 35 U.S.C. 154(b) by 938 days.

(21) Appl. No.: 11/371,444

(22) Filed: Mar. 9, 2006

(65) Prior Publication Data

US 2006/0205623 A1 Sep. 14, 2006

(30) Foreign Application Priority Data

Mar. 11, 2005 (JP) .............................. 2005-069221

(51) Int. Cl.
*C11D 7/50* (2006.01)
(52) U.S. Cl. .................. 510/175; 510/176; 134/1.3
(58) Field of Classification Search ................ 510/175, 510/176; 134/1.3
See application file for complete search history.

(56) References Cited

U.S. PATENT DOCUMENTS

| 4,215,005 | A | * | 7/1980 | Vander Mey ................ 510/176 |
| 4,786,578 | A | | 11/1988 | Neisius et al. |
| 4,824,762 | A | | 4/1989 | Kobayashi et al. |
| 4,832,802 | A | * | 5/1989 | Canaris ...................... 205/246 |
| 5,334,332 | A | | 8/1994 | Lee |
| 5,480,585 | A | | 1/1996 | Shiotsu et al. |
| 5,567,574 | A | | 10/1996 | Hasemi et al. |
| 5,569,778 | A | * | 10/1996 | Umemoto et al. ........... 560/121 |
| 5,792,274 | A | * | 8/1998 | Tanabe et al. ................ 134/1.3 |
| 5,905,063 | A | * | 5/1999 | Tanabe et al. ............... 510/176 |
| 5,968,848 | A | * | 10/1999 | Tanabe et al. ............... 438/745 |
| 6,068,000 | A | * | 5/2000 | Tanabe et al. ................ 134/1.3 |
| 6,462,005 | B1 | | 10/2002 | Gotoh et al. |
| 6,815,151 | B2 | * | 11/2004 | Tanabe et al. ............... 430/329 |
| 7,273,813 | B2 | * | 9/2007 | Emami et al. ............... 438/678 |
| 2001/0038976 | A1 | * | 11/2001 | Tanabe et al. ............... 430/325 |
| 2004/0147421 | A1 | | 7/2004 | Charm et al. |
| 2004/0180300 | A1 | | 9/2004 | Minsek et al. |
| 2005/0014667 | A1 | | 1/2005 | Aoyama et al. |
| 2006/0016785 | A1 | * | 1/2006 | Egbe et al. ..................... 216/83 |
| 2006/0040838 | A1 | * | 2/2006 | Shimada et al. ............. 510/175 |
| 2006/0046944 | A1 | * | 3/2006 | Hata et al. ................... 510/175 |
| 2006/0205623 | A1 | * | 9/2006 | Oowada et al. ............. 510/175 |
| 2006/0293208 | A1 | * | 12/2006 | Egbe et al. .................. 510/407 |
| 2007/0054138 | A1 | * | 3/2007 | Lau et al. .................. 428/472.3 |
| 2007/0060490 | A1 | * | 3/2007 | Skee .......................... 510/175 |
| 2007/0160930 | A1 | * | 7/2007 | Wang et al. ............... 430/270.1 |
| 2007/0161528 | A1 | * | 7/2007 | Wu et al. .................... 510/175 |
| 2007/0179072 | A1 | * | 8/2007 | Rao et al. ................... 510/175 |
| 2008/0039356 | A1 | * | 2/2008 | Palmer et al. ............... 510/424 |
| 2008/0210900 | A1 | * | 9/2008 | Wojtczak et al. ........... 252/79.3 |
| 2008/0269096 | A1 | * | 10/2008 | Visintin et al. .............. 510/176 |

FOREIGN PATENT DOCUMENTS

| EP | 1 031 884 A2 | 8/2000 |
| EP | 1 138 726 A1 | 10/2001 |
| EP | 1 335 016 A1 | 8/2006 |
| JP | 64-73348 A | 3/1989 |
| JP | 5-281753 A | 10/1993 |
| JP | 7064297 A | 3/1995 |
| JP | 7-201794 A | 8/1995 |
| JP | 8-202052 A | 8/1996 |
| JP | 8-262746 A | 10/1996 |
| JP | 8-334905 A | 12/1996 |
| JP | 9-197681 A | 7/1997 |
| JP | 2000-162788 A | 6/2000 |
| JP | 2002-214805 A | 7/2002 |
| WO | WO 2004/059700 A2 | 7/2004 |
| WO | WO 2004/094581 A1 | 11/2004 |

* cited by examiner

Primary Examiner—Gregory E Webb
(74) Attorney, Agent, or Firm—Wolf, Greenfield & Sacks, P.C.

(57) ABSTRACT

The present invention provides a composition for photoresist stripping solution which shows a superior stripping property of photoresists and damaged photoresist layers remained after dry etching in the fabrication process of semiconductor circuit devices, without attacking new wiring materials and interlayer insulating film materials, as well as a process of stripping of photoresists and damaged photoresist layers. The composition for photoresist stripping solution which contains at least one of acetylene alcohol compounds and organic sulfonic acid compounds, and at least one of polyvalent alcohols and their derivatives is used.

11 Claims, No Drawings

COMPOSITION FOR PHOTORESIST STRIPPING SOLUTION AND PROCESS OF PHOTORESIST STRIPPING

DETAILED DESCRIPTION OF THE INVENTION

1. Technical Field

The invention relates to a composition for photoresist stripping solution, more particularly a composition for photoresist stripping solution to remove a photoresist, a damaged photoresist layer, and a side-wall-protecting deposition film, etc., after dry etching of wiring materials, capacitors, and electrode materials in the fabrication of semiconductor circuit devices using copper as a wiring material and various low-dielectric interlayer insulating films as interlayer insulating film materials, without attacking the wiring material and various low-dielectric interlayer insulating films.

2. Background Art

Dry etching is the most important technology used for pattern formation of interlayer insulating film materials and wiring materials in a fabrication process of semiconductor circuit devices. Dry etching is a technology, wherein a film of an interlayer insulating film material and a wiring material is formed on a substrate, and the substrate is coated with a photoresist by means of, e.g., sputtering, CVD, electroplating and rotation coating, then is exposed and developed to obtain a pattern; subsequently, an reactive gas is applied to the pattern using the photoresist as a mask to form an interlayer insulating film and a wiring pattern. On the substrate after dry etching, there remain the photoresist used as a mask as well as a damaged photoresist layer generated by the reaction between the photoresist and the etching gas. In addition, a side-wall-protecting deposition film remains on the side walls of the etched material which are exposed on the surface after etching. A side-wall-protecting deposition film is used for anisotropic etching such as in the formation of metal-wiring side tapers and via holes, and a thick side-wall-protecting deposition film is formed when a plane with high anisotropy, for example, that having a via hole with a larger depth relative to its diameter, is formed. These damaged photoresist layer and side-wall-protecting deposition film must be removed from the substrate before proceeding to the next fabrication process.

As a technology to remove a photoresist on a substrate, there are a wet stripping method wherein the photoresist is removed from the substrate by dissolving or partially dissolving the photoresist using a chemical agent called photoresist stripping solution, and a dry stripping method wherein the photoresist and damaged photoresist layer are ashed by oxygen gas and other gases in a plasma state and removed, which is called ashing. An appropriate method for each fabrication process is selected.

Conventionally, ashing has been mainly used for the removal of photoresists and damaged photoresist layers. When complete removal of photoresists and ashed products derived from damaged photoresist layers is difficult by means of ashing alone, a treatment using a solution for the removal of photoresist residues is co-applied after ashing. In addition, for the removal of side-wall-protecting deposition films which is difficult to achieve by ashing, stripping by wet-process is also adopted. The photoresist residue referred to here means any of photoresist residues which are incompletely-ashed products remained on a substrate surface after an ashing treatment, side-wall polymers remained at wiring and at via-hole side surfaces (also called side-wall protecting films or rabbit ears), and organic metal polymers and metal oxides remained at side and bottom surfaces of via holes.

In the case of stripping by wet-process, when an acidic photoresist stripping solution, which uses alkylbenzene and alkylbenzene sulfonic acid, or an alkaline photoresist stripping solution such as alkanolamine, both of which are used for the stripping of damaged photoresist layers formed by ion irradiation or heat, is used, it is difficult to remove damaged photoresist layers formed by dry etching. Accordingly, a photoresist stripping solution consisting of alkanolamine, dihydroxybenzene and dimethylsulfoxide has been proposed (JP, A, 5-281753).

Furthermore, a part of the photoresist residues, such as side-wall polymers remained at wiring and side walls of a via hole and organic metal polymers remained at side walls and bottom of a via hole, as well as etched materials such as wiring materials, has been converted to inorganic substances. Accordingly, as a composition for washing which has two functions, i.e., a function to remove photoresists and a function to remove inorganic components, a composition containing hydroxylamine and alkanolamine as major components has been proposed (U.S. Pat. No. 5,334,332). In addition, as a washing agent to remove only inorganic components, a composition consisting of ammonium fluoride, tetraalkylammonium acetate, dimethylformamide and water has been proposed (JP, A, 7-201794).

However, when such a photoresist stripping solution or a photoresist-residue stripping solution is used, it is necessary to rinse using an organic solvent such as isopropyl alcohol to prevent wiring materials from corrosion, and it is necessary to perform the treatment under a high temperature for complete removal of photoresist residues. Moreover, because the composition of a photoresist residue is similar to that of a wiring material, a wiring material may be corroded during the treatment of a substrate using such a photoresist-residue stripping solution, which is problematic. Accordingly, an agent containing sugar alcohol such as sorbitol as a corrosion inhibitor for wiring materials has been proposed (JP, A, 8-262746).

Meanwhile, with a progress in miniaturization and performance of semiconductor circuit devices in recent years, new wiring materials and interlayer insulating film materials are begun to be adopted; accompanying with this, there appears a limitation in using conventionally-used photoresist-residue stripping solutions as they are. For example, due to the requirement of miniaturization of semiconductor circuit devices and their high speed operation, the introduction of copper wiring has been examined with the aim of reduction in wiring resistance, and the formation of copper wiring using a damascene process has been realized. In a damascene process, a wiring pattern is formed on an interlayer insulating film as grooves, and copper is embedded in the grooves using sputtering or electroplating, then unnecessary blanket copper is removed by a method such as chemical mechanical polishing (CMP) to form the copper wiring pattern. As a photoresist stripping solution for this copper wiring material, which is a new wiring material, a stripping solution containing alkanolamine as a major component, benzotriazole as a corrosion inhibitor for copper, and an acetylene alcohol-alkylene oxide adduct which aims at improving the permeability and wettability of the stripping solution has been proposed (JP, A, 2000-162788); however, triazole compounds such as benzotriazole have a poor biodegradability, causing a problem of high load on a wastewater treatment. In addition, because triazole compounds have low solubility to water, these corrosion inhibitors remain on the wafer surface after rinsing with water, which may exert harmful influence to later processes.

As a photoresist stripping solution for substrates with copper wiring, a composition consisting of a water-soluble organic solvent such as alkanolamine, amines and glycols, and water (JP, A, 2002-214805) has been proposed.

Meanwhile, due to the requirement of miniaturization and high speed operation of semiconductor circuit devices in recent years similarly, the introduction of a low-dielectric interlayer insulating film (so-called a low-k film) has been examined with the aim of reducing interwiring capacity. Generally, low-k films include organic films represented by aromatic aryl compounds, siloxane films represented by hydrogen silsesquioxane (HSQ) and methyl silsesquioxane (MSQ), and porous silica films. When such wiring materials and interlayer insulating film materials are used to fabricate semiconductor circuit devices, dry etching of various low-k films is carried out to form via holes and upper wiring grooves which connect lower copper wiring with upper wiring. During this process, similar to the fabrication process of semiconductor circuit devices using conventional wiring materials and interlayer insulating film materials, a photoresist on a substrate must be removed after dry etching before proceeding to the next fabrication process. However, when ashing is carried out using plasma-state oxygen gas, etc., a damaged layer with excessive oxygen is generated on the low-k film surface due to the oxygen gas, particularly when a low-k film such as a porous silica film is used, and this increases the dielectric constant of the entire interlayer insulating film; furthermore, when a fluorine-system removing solution for photoresist residues is used for the removal of photoresist residues after ashing, a damaged layer with excessive oxygen is etched, resulting in an alteration of the shape of via holes and wiring grooves.

Accordingly, stripping of a photoresist after dry etching by means of stripping by wet-process is being desired. However, a photoresist stripping solution for aluminum which contains a fluorine compound and hydroxylamine induces significant damages such as reduction in copper film, reduction in low-k film, structural change, dielectric constant change and change in mechanical strength, and therefore its use is impossible. Furthermore, with respect to photoresist stripping solutions for copper, many of them are strong alkaline solutions containing organic amines such as alkanolamine or organic alkalis such as tetramethylammonium hydroxide, or solutions containing fluorine compounds such as ammonium fluoride; therefore, they induce damages such as reduction in low-k film, structural change, dielectric constant change and change in mechanical strength and hence their use is impossible.

Moreover, when low-k films such as siloxane films and porous silica films are processed by dry etching, fluorocarbons such as $C_4F_6$ and $C_4F_8$ are used as an etching gas; however, these fluorocarbons form very strong damaged photoresist layers by the interaction with the photoresist, which cannot be removed by a conventional photoresist stripping solution.

As stated above, although various photoresist stripping solutions and photoresist-residue stripping solutions suitable for conventional wiring materials and interlayer insulating film materials have become available, to date no photoresist stripping solution has been found which can remove a photoresist on a substrate by wet-process in a fabrication process of semiconductor circuit devices with new wiring materials and interlayer insulating film materials, in particular semiconductor circuit devices with copper wires and low-dielectric films such as low-k films.

As examples of using acetylene alcohol as a component of photoresist stripping solution, a composition containing alkylbenzene sulfonic acid or alkylphenol and acetylene alcohol (JP, A, 1-73348), a composition containing monoethanolamine of organic amine system (JP, A, 7-64297), a composition containing hydroxylamine system (JP, A, 8-334905), a composition consisting of hydrofluoric acid and a water-soluble organic solvent (JP, A, 8-202052), and a composition consisting of ammonium fluoride system and a water-soluble organic solvent (JP, A, 9-197681) have been reported, but none of them do not have a sufficient effect of photoresist stripping.

DISCLOSURE OF THE INVENTION

Problem To Be Solved By the Invention

The object of the invention is, therefore, to provide a composition for photoresist stripping solution which shows a superior stripping property of a photoresist remained after dry etching and a damaged photoresist layer generated by the reaction with the etching gas in the fabrication process of semiconductor circuit devices, without attacking new wiring materials and intelayer insulating film materials such as copper wires and low-dielectric films, as well as a process of photoresist stripping.

Means of Solving the Problem

The inventors of the present invention devoted themselves to the research of solving the above problems, and found that a composition for photoresist stripping solution containing at least one of acetylene alcohol compounds and organic sulfonic acid compounds, and at least one of polyvalent alcohols and their derivatives shows a superior stripping property of photoresists remained after dry etching, without attacking new wiring materials and interlayer insulating film materials, and completed this invention.

Namely, the invention relates to a composition for photoresist stripping solution containing at least one of acetylene alcohol compounds and organic sulfonic acid compounds, and at least one of polyvalent alcohols and their derivatives.

The invention also relates to the composition for photoresist stripping solution further containing at least one of fluorine compounds and quaternary ammonium hydroxide salts.

Furthermore, the invention relates to the composition for photoresist stripping solution, wherein the acetylene alcohol compound is 2-butyne-1,4-diol.

The invention also relates to the composition for photoresist stripping solution, wherein the organic sulfonic acid compound is methanesulfonic acid.

Furthermore, the invention relates to the composition for photoresist stripping solution, wherein the fluorine compound is ammonium fluoride.

The invention also relates to the composition for photoresist stripping solution, wherein a water content is 10 mass % or less relative to the composition.

Furthermore, the invention relates to the composition for photoresist stripping solution, wherein the composition is used for the fabrication of semiconductor circuit devices having copper as a wiring material or a low-dielectric film as an interlayer insulating film.

The invention also relates to a process of photoresist stripping, wherein the above composition for photoresist stripping solution is used.

Furthermore, the invention relates to a process of photoresist stripping comprising a treatment using a first solution which contains at least one of acetylene alcohol compounds and organic sulfonic acid compounds, and a treatment using a second solution which contains at least one of polyvalent alcohols and their derivatives.

The invention also relates to the process of photoresist stripping, wherein the second solution contains at least one of fluorine compounds and quaternary ammonium hydroxide salts.

Furthermore, the invention relates to the process of photoresist stripping, wherein the process is used for the fabrication of semiconductor circuit devices having copper as a wiring material or a low-dielectric film as an interlayer insulating film.

Due to dry etching of a substrate on which a photoresist is formed, a damaged photoresist layer is generated on the photoresist surface, and a side-wall-protecting deposition film is generated on the side walls of the etched material which are exposed after etching. It is considered that the damaged photoresist layer and the side-wall-protecting deposition film are mainly composed of (1) substances derived from etching gas, (2) substances generated by the reaction between etching gas and photoresist, (3) substances generated by the reaction between etching gas, photoresist and an etched material, and (4) substances generated by the reaction between etching gas and an etched material. It is considered that, the surface of the photoresist is mainly composed of (1) and (2), and a section near the interface between the etched material and the resist is mainly composed of (1), (2) and (3), and a section of the etched material distant from the resist is mainly composed of (1) and (4). A photoresist in the "composition for photoresist stripping solution" and "process of photoresist stripping" herein refers to the meaning which includes not only the photoresist, but also the above-described damaged photoresist layer and the side-wall protecting deposition film.

The present invention is based on the findings that a damaged photoresist layer and a side-wall protecting deposition film can be simultaneously removed together with a photoresist through appropriate selection of a stripping solution, because effects of stripping damaged photoresist layers and side-wall protecting deposition films depend on their thickness, and because thicknesses of damaged photoresist layers and side-wall protecting deposition films are mostly identical.

The composition for photoresist stripping solution of the invention is suitable for removing a photoresist after dry etching; in particular, it has a characteristic that it can directly remove a photoresist together with a damaged photoresist layer and a side-wall protecting deposition film by wet-process. Furthermore, because the composition for photoresist stripping solution of the invention does not require an ashing treatment after dry etching, it is particularly suitable for substrates with copper wiring and a low-dielectric film that are damaged by an ashing treatment.

The composition for photoresist stripping solution of the invention comprises at least one of acetylene alcohol compounds and organic sulfonic acid compounds, and at least one of polyvalent alcohols and their derivatives. Both of the acetylene alcohol compounds and organic sulfonic acid compounds have a high degree of photoresist-stripping effect, and do not damage copper and low-k films.

Acetylene alcohol compounds and organic sulfonic acid compounds have, in addition to the photoresist-stripping function, a function to swell chemically-strong damaged photoresist layers and side-wall protecting deposition films formed by the reaction between etching gas (fluorocarbons such as $C_4F_6$, $C_4F_8$) and a photoresist, etc., or a function to loosen the binding of damaged photoresist layers and side-wall protecting deposition films; due to these functions, the composition can remove damaged photoresist layers and side-wall protecting deposition films which are difficult to be removed by a conventional stripping solution, together with the photoresist. Moreover, by combining a polyvalent alcohol with at least one of acetylene alcohol compounds and organic sulfonic acid compounds, the photoresist and others can be easily removed from the substrate. Polyvalent alcohols have a particularly high solubility to the photoresist for excimer laser, and have higher photoresist-stripping capability compared with monovalent alcohols; accordingly, they are capable of easily stripping damaged photoresist layers and side-wall protecting deposition films that were swollen by an acetylene alcohol compound and/or an organic sulfonic acid compound, together with the photoresist. In addition, since polyvalent alcohols have a high ignition point, different from monovalent alcohols such as isopropyl alcohol which have a low ignition point and whose handling is difficult, the polyvalent alcohols have an advantage of showing superior safety even under the treatment condition of fairly high temperature. Furthermore, by the addition of at least one of fluorine compounds and quaternary ammonium hydroxide salts into the composition for photoresist stripping solution, its removal effect can be further enhanced.

The process of photoresist stripping of the invention comprises a treatment using a first solution which contains at least one of acetylene alcohol compounds and organic sulfonic acid compounds, and a treatment using a second solution which contains at least one of polyvalent alcohols and their derivatives. By dividing the composition for photoresist stripping solution into two kinds of solutions, a substrate is treated under conditions (temperature, time, etc.) suitable for loosening the binding of damaged photoresist layers using the first solution which contains at least one of acetylene alcohol compounds and organic sulfonic acid compounds without damaging wiring materials and interlayer insulating film materials, and then the damaged photoresist layer and side-wall protecting deposition film with loosened binding can be removed from the substrate together with the photoresist using the second solution that is suitable for stripping photoresists. The treatment using the second solution may be carried out under a lower temperature in a shorter time compared with the treatment using the first solution. Accordingly, by further blending a fluorine compound or a quaternary ammonium hydroxide salt, which tends to damage wiring materials and interlayer insulating film materials but shows a higher photoresist-stripping effect, into the second solution, the photoresist-stripping effect can be enhanced without damaging wiring materials and interlayer insulating film materials.

According to the invention, by treating a substrate using the composition for photoresist stripping solution which comprises at least one of acetylene alcohol compounds and organic sulfonic acid compounds, and at least one of polyvalent alcohols and their derivatives, the photoresist with a damaged photoresist layer and a side-wall protecting deposition film each having a thickness of 5 nm or smaller can be easily removed.

Furthermore, the composition containing at least one of acetylene alcohol compounds and organic sulfonic acid compounds, at least one of polyvalent alcohols and their derivatives, and at least one of fluorine compounds and quaternary ammonium hydroxide salts shows a higher stripping ability; by treating a substrate using this compound, the photoresist with a damaged photoresist layer and a side-wall protecting deposition film each having a thickness more than 5 nm and 10 nm or smaller can be easily separated.

Moreover, by treating a substrate first using the first solution containing at least one of acetylene alcohol compounds and organic sulfonic acid compounds, then using the second solution containing at least one of polyvalent alcohols and their derivatives, the photoresist with a damaged photoresist layer and a side-wall protecting deposition film each having a thickness of more than 10 nm can be easily removed.

Effect of the Invention

As stated above, the composition for photoresist stripping solution of the invention can well remove the photoresist remained after dry etching, particularly the photoresist remained on a substrate that has copper wiring and an interlayer insulating film consisting of a low-dielectric film such as a low-k film, without damaging the copper wiring and the low-dielectric film. Therefore, the composition is effective as a composition for photoresist stripping solution in a fabrication process of semiconductor circuit devices.

Best Mode for Carrying Out the Invention

The polyvalent alcohols and their derivatives used in the composition for photoresist stripping solution of the invention include 1,2-ethanediol, 1,2-propanediol, 1,3-propanediol, 1,2-butanediol, 1,3-butanediol, 1,4-butanediol, ethylene glycol monomethyl ether, ethylene glycol monoethyl ether, ethylene glycol monobutyl ether, diethylene glycol, diethylene glycol monomethyl ether, diethylene glycol monoethyl ether, diethylene glycol monopropyl ether, propylene glycol monomethyl ether, propylene glycol monoethyl ether, propylene glycol monopropyl ether, dipropylene glycol monomethyl ether, dipropylene glycol monobutyl ether, tripropylene glycol monomethyl ether and the like. Among these, 1,2-ethanediol, 1,2-propanediol, 1,2-butanediol, 1,3-butanediol, 1,4-butanediol, propylene glycol monomethyl ether, propylene glycol monoethyl ether and the like are preferred, and more preferred are 1,2-ethanediol, 1,2-propanediol, 1,3-butanediol, 1,4-butanediol, propylene glycol monoethyl ether and the like. Each of these polyvalent alcohols and their derivatives may be used alone, or two or more kinds of these may be combined. The concentration of a polyvalent alcohol and its derivatives may be appropriately determined depending on a subject to be removed; preferably, it is 70-99.9 mass % relative to the entire composition, and most preferably it is 90-99.5 mass %.

The acetylene alcohol compound used in the composition for photoresist stripping solution of the invention includes 2-butyne-1,4-diol, 3,5-dimethyl-1-hexyne-3-ol, 2-methyl-3-butyne-2-ol, 3-methyl-1-pentyne-3-ol, 2,4-dimethyl-1-octyne-3-ol, 3,6-dimethyl-4-octyne-3,6-diol, 3,7-dimethyl-1-octyne-3-ol, 2,4,7,9-tetramethyl-5-decyne-4,7-diol, 3-hexyne-2,5-diol, 2,5-dimethyl-3-hexyne-2,5-diol and the like. Among these, 2-butyne-1,4-diol is preferred. Each of these acetylene alcohols may be used alone, or two or more kinds may be combined. The concentration of an acetylene alcohol compound may be appropriately determined depending on a subject to be removed; preferably, it is 0.1-10 mass % relative to the entire composition, and most preferably it is 0.5-5 mass %.

The organic sulfonic acid compound used in the composition for photoresist stripping solution of the invention is preferably alkylsulfonic acid with 1-4 carbon atoms, arylsulfonic acid with 6-8 carbon atoms, or heteroarylsulfonic acid with 5-7 carbon atoms, which may have a substituent. Examples of preferred organic sulfonic acid compounds include methanesulfonic acid, ethanesulfonic acid, propanesulfonic acid, aminomethanesulfonic acid, benzenesulfonic acid, toluenesulfonic acid, phenolsulfonic acid, pyridinesulfonic acid and the like. Among these, methanesulfonic acid is preferred. Each of these organic sulfonic acid compounds may be used alone, or two or more kinds may be combined. The concentration of an organic sulfonic acid compound may be appropriately determined depending on a subject to be removed; preferably, it is 0.1-30 mass % relative to the entire composition, and most preferably it is 0.5-5 mass %.

The fluorine compound used in the composition for photoresist stripping solution of the invention is a hydrofluoric acid, a fluoride of ammonium or amine. Examples include ammonium fluoride, ammonium acid fluoride, methylamine hydrofluoride, ethylamine hydrofluoride, propylamine hydrofluoride, tetramethylammonium fluoride, tetraethylammonium fluoride, ethanolamine hydrofluoride, methylethanolamine hydrofluoride, dimethylethanolamine hydrofluoride, triethylenediamine hydrofluoride and the like. Among these, ammonium fluoride is preferable since it has a low metallic impurity content, and it is readily available. Each of these fluorine compounds may be used alone, or two or more kinds may be combined. The concentration of a fluorine compound may be appropriately determined depending on a subject to be removed; preferably, it is 0.01-0.1 mass % relative to the entire composition, and most preferably it is 0.02-0.04 mass %.

The quaternary ammonium hydroxide salt used in the composition for photoresist stripping solution of the invention includes tetramethylammonium hydroxide (hereafter referred to as TMAH), tetraethylammonium hydroxide, tetrapropylammonium hydroxide, tetrabutylammonium hydroxide, trimethylethylammonium hydroxide, dimethyldiethylammonium hydroxide, trimethyl(2-hydroxyethyl)ammonium hydroxide (choline), triethyl(2-hydroxyethyl)ammonium hydroxide and the like. Among these, TMAH is preferred. Each of these quaternary ammonium hydroxide salts may be used alone, or two or more kinds may be combined. The concentration of a quaternary ammonium hydroxide salt may be appropriately determined depending on a subject to be removed; preferably, it is 1-10 mass % relative to the entire composition, and most preferably it is 2-6 mass %.

The water content of the composition for photoresist stripping solution may be appropriately determined depending on a subject to be removed; for example, when a fluorine compound or a quaternary ammonium hydroxide salt is contained, and when the degree of dissociation of the fluorine compound or quaternary ammonium hydroxide salt is large, while removability of resists and damaged resist layers increases, attacking on copper and various low-k films becomes severe; hence, the water content of 10 mass % or less relative to the composition is preferred.

The process of treatment using the composition for photoresist stripping solution of the invention is not particularly limited; for example, by immersing a substrate into the composition, a damaged photoresist layer and a side-wall-protecting deposition film can be removed together with the photoresist. The treatment condition is not particularly limited as well, generally, it may be 40-90° C. and 5-30 min.

In the process of photoresist stripping of the invention, at first the first-step treatment using the first solution containing an acetylene alcohol compound or an organic sulfonic acid compound is applied to a substrate after dry etching, then the second-step treatment using the second solution containing at least one of polyvalent alcohols and their derivatives is applied.

The treatment using the stripping solution is not particularly limited so long as the stripping solution can be effectively in contact with the photoresist; preferably, a dipping process is used. The treatment condition using the stripping solution can be appropriately varied depending on resist materials and dry-etching conditions. Generally, the first-step treatment is carried out under the temperature range of preferably 40-100° C., more preferably 50-90° C., with treatment time of preferably 3-40 min, more preferably 5-30 min. The second-step treatment may be carried out under heating or at room temperature, but preferably under the temperature range of 25-90° C., and more preferably 25-80° C. The treatment time may be fairly short, it is preferably 3-20 min, and more preferably 5-15 min.

In a preferred embodiment of the process of photoresist stripping of the invention, the first-step and the second-step treatments are carried out by dipping a subject into each of the first solution and the second solution described above. At this time, to increase the stripping ability, at least one of fluorine compounds and quaternary ammonium hydroxide salts may be added to the second solution. In addition, at least one of polyvalent alcohols and their derivatives may be contained in the first solution, and in the case when the first solution contains an organic sulfonic acid, the second solution may contain an acetylene alcohol compound.

After stripping the photoresist and damaged photoresist layer, a rinsing treatment is applied. In the rinsing treatment, the substrate may be washed with water, or if necessary, washed with alcohol, ketone or others, followed by washing with water.

EXAMPLES

The composition for photoresist stripping solution of the present invention is explained in further detail with reference to Examples below. However, the invention should not be construed as being limited by these Examples.

Examples 1-28, Comparative Examples 1-36

I. Preparation of Composition for Photoresist Stripping Solution

Each of the compositions for photoresist stripping solution is prepared by adding the components constituting the compositions for photoresist stripping solution listed in Tables 1a-3b, and mixing them uniformly.

II. Test to Evaluate the Tripping of Photoresists and Damaged Photoresist Layers 1) Evaluation test 1

Examples 1-15 and Comparative Examples 1-21: Cases Wherein Thicknesses (T) of the Damaged Photoresist Layers and Side-Wall Protecting Deposition Films are T≦5 nm A film of Cu damascene wiring and an interlayer insulating film (low-k film) were sequentially formed on a silicon wafer with Ta as a barrier metal, and a KrF photoresist was coated on the interlayer insulating film, exposed and developed; then dry etching was carried out using the photoresist as a mask to form a via hole. This wafer was dipped in N-methyl-2-pyrrolidinone at 50° C. for 10 min, and treated by running-water rinsing in ultrapure water and drying, to obtain the wafer for photoresist evaluation (a wafer subjected to the identical treatment was dipped in N-methyl-2-pyrrolidinone at 50° C. for 10 min, treated by running-water rinsing in ultrapure water and drying, then the cross section of this wafer was observed by an electron microscope; the result of the observation showed that a thin film of damaged photoresist layer and a thin side-wall protecting deposition film (5 nm or less) were generated on the photoresist surface and the side walls of the via hole).

The obtained wafers for photoresist evaluation were dipped in each of the photoresist stripping solutions listed in Tables 1a-1d at 80° C. for 10 min, treated by running-water rinsing in ultrapure water and drying, then the stripping property of photoresists and damaged photoresist layers, Cu attacking property, and low-k film attacking property were confirmed by an electron microscope. Tables 1a-1d show the results.

TABLE 1a

|  | Composition for photoresist stripping solution (wt %) | Evaluation result ||||
|---|---|---|---|---|---|
|  |  | Resist stripping property·✕·8 | damaged-layer stripping property·✕·9 | Cu attacking property·✕·10 | Low-k film attacking property·✕·11 |
| Comparative example 1 | DMSO·✕·1 (70), MEA·✕·3 (10), 1,3-dimethyl-2-imidazolidinone(20)·✕·A | ○ | X | X | X |
| Comparative example 2 | DMSO·✕·1 (80), MEA·✕·3 (10), TMAH·✕·4 (0.2)·✕·B | ○ | X | X | X |
| Comparative example 3 | 2-(2-aminoethoxy)ethanol, hydroxylamine, catechol·✕·C | ○ | X | X | X |
| Comparative example 4 | monoethanolamine, catechol, organic solvent·✕·D | ○ | X | X | X |
| Comparative example 5 | 1-methoxy-2-propanol(70), diammonium hydrogen citrate(1)·✕·E | ○ | X | ○ | ○ |
| Comparative example 6 | DMSO·✕·1 (100) | ○ | X | ○ | ○ |
| Comparative example 7 | Toluen (100) | X | X | ○ | ○ |
| Comparative example 8 | Xylene (100) | X | X | ○ | ○ |
| Comparative example 9 | 1,2-ethanediol (100) | ○ | X | ○ | ○ |
| Comparative example10 | 1,2-propanediol (100) | ○ | X | ○ | ○ |

TABLE 1b

| | Composition for photoresist stripping solution (wt %) | Evaluation result | | | |
|---|---|---|---|---|---|
| | | Resist stripping property※8 | damaged-layer stripping property※9 | Cu attacking property※10 | Low-k film attacking property※11 |
| Comparative example 11 | 1,3-propanediol (100) | ○ | X | ○ | ○ |
| Comparative example 12 | 1,3-butanediol (100) | ○ | X | ○ | ○ |
| Comparative example 13 | 1,4-butanediol (100) | ○ | X | ○ | ○ |
| Comparative example 14 | 1,5-pentanediol (100) | ○ | X | ○ | ○ |
| Comparative example 15 | PGM※5 (100) | ○ | X | ○ | ○ |
| Comparative example 16 | PGE※6 (100) | ○ | X | ○ | ○ |
| Comparative example 17 | NMP※2 (100) | ○ | X | ○ | ○ |
| Comparative example 18 | MEA※3 (100) | ○ | X | X | X |
| Comparative example 19 | Water (75) TMAH※4 (25) | X | X | X | X |
| Comparative example 20 | 1,3-propanediol (99) water (0.75) TMAH※4 (0.25) | ○ | X | ○ | ○ |

TABLE 1c

| | Composition for photoresist stripping solution (wt %) | Evaluation result | | | |
|---|---|---|---|---|---|
| | | Resist striping property※8 | damaged-layer stripping property※9 | Cu attacking property※10 | Low-k film attacking property※11 |
| Comparative example 21 | 1,3-butanediol (99.95) water (0.04) NH₄F (0.01) | ○ | X | ○ | ○ |
| Example 1 | 1,2-ethanediol (99) BuDiol※7 (1) | ○ | ⊚ | ○ | ○ |
| Example 2 | 1,2-propanediol (99.5) BuDiol※7 (0.5) | ○ | ○ | ○ | ○ |
| Example 3 | 1,2-propanediol (99) BuDiol※7 (1) | ○ | ⊚ | ○ | ○ |
| Example 4 | 1,2-propanediol (98) BuDiol※7 (2) | ○ | ○ | ○ | ○ |
| Example 5 | 1,3-propanediol (99.5) BuDiol※7 (0.5) | ○ | ○ | ○ | ○ |
| Example 6 | 1,3-butanediol (95) BuDiol※7 (5) | ○ | ○ | ○ | ○ |
| Example 7 | 1,3-butanediol (90) BuDiol※7 (10) | ○ | ○ | ○ | ○ |
| Example 8 | 1,4-butanediol (99) BuDiol※7 (1) | ○ | ⊚ | ○ | ○ |
| Example 9 | 1,4-butanediol (95) BuDiol※7 (5) | ○ | ⊚ | ○ | ○ |
| Example 10 | 1,5-pentanediol (99) BuDiol※7 (1) | ○ | ⊚ | ○ | ○ |

TABLE 1d

| | Composition for photoresist stripping solution (wt %) | Evaluation result | | | |
|---|---|---|---|---|---|
| | | Resist stripping property※8 | damaged-layer stripping property※9 | Cu attacking property※10 | Low-k film attacking property※11 |
| Example 11 | PGM※5 (99) BuDiol※7 (1) | ○ | ⊚ | ○ | ○ |
| Example 12 | PGE※6 (99) BuDiol※7 (1) | ○ | ⊚ | ○ | ○ |
| Example 13 | PGE※5 (39) d-10-camphor-sulfonic acid (1) Water (60) | ○ | ○ | ○ | ○ |
| Example 14 | PGE※6 (70) Methanesulfonic acid (30) | ○ | ⊚ | ○ | ○ |
| Example 15 | PGE※6 (80) Methanesulfonic acid (10) Water (10) | ○ | ⊚ | ○ | ○ |

※1: dimethyl sulfoxide,
※2: N-methyl-2-pyrrolidinone,
※3: monoethanolamine,
※4: tetramethylammonium hydroxide,
※5: 1-methoxy-2-propanol,
※6: 1-ethoxy-2-propanol,
※7: 2-butyne-1,4-diol,
※8: Resist removability: ○ good, X not removable,
※9: damaged-layer removability: ⊚ good, ○ fairly good, Δ partially remained, X not removable,
※10: Cu attacking property: ○ no attack, X occurrence of corrosion, TABLE 1d-continued

|  | Evaluation result | | | |
|---|---|---|---|---|
| Composition for photoresist stripping solution (wt %) | Resist stripping property※8 | damaged-layer stripping property※9 | Cu attacking property※10 | Low-k film attacking property※11 |

※11: low-k film attacking property: ○ no attack, X occurrence of chemical and physical changes.
※A: KP-201(Commercial product, Kanto Kagaku Kabushiki Kaisha),
※B: SPR-201(Commercial product, Kanto Kagaku Kabushiki Kaisha),
※C: EKC-265(Commercial product, EKC TECHNOLOGY),
※D: ELM-MR10(Commercial product, Mitsubishi Gas Chemical Company, Inc.),
※E: SPR-501(Commercial product, Kanto Kagaku Kabushiki Kaisha)

2) Evaluation Test 2

Examples 16-21 and Comparative Examples 22-31: Cases Wherein Thicknesses (T) of the Damaged Photoresist Layers and Side-Wall Protecting Deposition Films are 5 nm<T≦10 nm A film of Cu damascene wiring and an interlayer insulating film (low-k film) were sequentially formed on a silicon wafer with Ta as a barrier metal, and a KrF photoresist was coated on the interlayer insulating film, exposed and developed; then dry etching was carried out using the photoresist as a mask to form a via hole. This wafer was dipped in N-methyl-2-pyrrolidinone at 50° C. for 10 min, and treated by running-water rinsing in ultrapure water and drying, to obtain the wafer for photoresist evaluation (a wafer subjected to the identical treatment was dipped in N-methyl-2-pyrrolidinone at 50° C. for 10 min, treated by running-water rinsing in ultrapure water and drying, then the cross section of this wafer was observed by an electron microscope; the result of the observation showed that a damaged photoresist layer or a side-wall protecting deposition film with a thickness of more than 5 nm and 10 nm or less were generated on the photoresist surface and the side walls of the via hole).

The obtained wafers for photoresist evaluation were dipped in each of the photoresist stripping solutions listed in Tables 2a-2b at 80° C. for 10 min, treated by running-water rinsing in ultrapure water and drying, then the stripping property of photoresists and damaged photoresist layers, Cu attacking property, and low-k film attacking property were confirmed by an electron microscope. Tables 2a-2b show the results.

TABLE 2a

|  | Composition for photoresist stripping solution (wt %) | Evaluation result | | | |
|---|---|---|---|---|---|
|  |  | Resist stripping property※8 | damaged-layer stripping property※9 | Cu attacking property※10 | Low-k film attacking property※11 |
| Comparative example 22 | 1,2-ethanediol (100) | ○ | X | ○ | ○ |
| Comparative example 23 | 1,2-propanediol (100) | ○ | X | ○ | ○ |
| Comparative example 24 | 1,3-propanediol (100) | ○ | X | ○ | ○ |
| Comparative example 25 | 1,3-butanediol (100) | ○ | X | ○ | ○ |
| Comparative example 26 | 1,4-butanediol (100) | ○ | X | ○ | ○ |
| Comparative example 27 | 1,5-pentanediol (100) | ○ | X | ○ | ○ |
| Comparative example 28 | PGM※1 (100) | ○ | X | ○ | ○ |
| Comparative example 29 | PGE※2 (100) | ○ | X | ○ | ○ |
| Comparative example 30 | 1,3-butanediol (99.95) water (0.04) NH$_4$F(0.01) | ○ | X | ○ | ○ |
| Comparative example 31 | 1,3-propanediol (99) water (0.75) TMAH※3 (0.25) | ○ | X | ○ | ○ |

TABLE 2b

|  | Composition for photoresist stripping solution (wt %) | Evaluation result | | | |
|---|---|---|---|---|---|
|  |  | Resist stripping property※8 | damaged-layer stripping property※9 | Cu attacking property※10 | Low-k film attacking property※11 |
| Example 16 | 1,3-butanediol (95) BuDiol※4 (4.95) water (0.03) NH$_4$F(0.02) | ○ | ◉ | ○ | ○ |
| Example 17 | 1,3-butanediol (95) BuDiol※4 (4.9) water (0.06) NH$_4$F(0.02) | ○ | ◉ | ○ | ○ |

TABLE 2b-continued

| | Composition for photoresist stripping solution (wt %) | Evaluation result | | | |
|---|---|---|---|---|---|
| | | Resist stripping property※8 | damaged-layer stripping property※9 | Cu attacking property※10 | Low-k film attacking property※11 |
| Example 18 | 1,3-butanediol (95) BuDiol※4 (4) water (0.75) TMAH※3 (0.25) | ○ | ◎ | ○ | ○ |
| Example 19 | 1,3-butanediol (95) BuDiol※4 (3) water (1) MP※5 (1) | ○ | ◎ | ○ | ○ |
| Example 20 | 1,3-butanediol (95) BuDiol※4 (3) water (1) PPERI※6 (1) | ○ | ◎ | ○ | ○ |
| Example 21 | 1,3-butanediol (95) BuDiol※4 (3) water (1) PPERA※7 (1) | ○ | ◎ | ○ | ○ |

※1: 1-methoxy-2-propanol,
※2: 1-ethoxy-2-propanol,
※3: tetramethylammonium hydroxide,
※4: 2-butyne-1,4-diol,
※5: morpholine,
※6: piperidine,
※7: piperazine.
※8: Resist removability: ○ good, X not removable,
※9: damaged-layer removability: ◎ good, ○ fairly good, Δ partially remained, X not removable,
※10: Cu attacking property: ○ no attack, X occurrence of corrosion,
※11: low-k film attacking property: ○ no attack, X occurrence of chemical and physical changes.

3) Evaluation Test 3

Examples 22-28 and Comparative Examples 32-36: Cases Wherein Thicknesses (T) of the Damaged Photoresist Layers and Side-Wall Protecting Deposition Films are 10 nm<T A film of Cu damascene wiring and an interlayer insulating film (low-k film) were sequentially formed on a silicon wafer with Ta as a barrier metal, and a ArF photoresist was coated on the interlayer insulating film, exposed and developed; then dry etching was carried out using the photoresist as a mask to form a via hole. This wafer was dipped in N-methyl-2-pyrrolidinone at 50° C. for 10 min, and treated by running-water rinsing in ultrapure water and drying, to obtain the wafer for photoresist evaluation (a wafer subjected to the identical treatment was dipped in N-methyl-2-pyrrolidinone at 50° C. for 10 min, treated by running-water rinsing in ultrapure water and drying, then the cross section of this wafer was observed by an electron microscope; the result of the observation showed that a damaged photoresist layer or a side-wall protecting deposition film with a thickness more than 10 nm were generated on the photoresist surface and the side walls of the via hole).

The obtained wafers for photoresist evaluation were dipped in each of the photoresist stripping solution (first solution) listed in Tables 3a-3b at 80° C. for 20 min, and treated by running-water rinsing in ultrapure water and drying. Then, the wafers were further dipped in the photoresist stripping solution (second solution) listed in Tables 3a-3b at 80° C. for 15 min, treated by running-water rinsing in ultrapure water and drying, then the stripping property of photoresists and damaged photoresist layers, Cu attacking property, and low-k film attacking property were confirmed by an electron microscope. Tables 3a-3b show the results.

TABLE 3a

| | Composition for photoresist stripping solution (wt %) | | Evaluation result | | | |
|---|---|---|---|---|---|---|
| | | | Resist stripping property※8 | damaged-layer stripping property※9 | Cu attacking property※10 | Low-k film attacking property※11 |
| Comparative example 32 | 1,3-butanediol (100) | | ○ | X | ○ | ○ |
| Comparative example 33 | PGM※1 (100) | | ○ | X | ○ | ○ |
| Comparative example 34 | PGE※2 (100) | | ○ | X | ○ | ○ |
| Comparative example 35 | 1,3-butanediol (99.95) water (0.04) NH$_4$F(0.01) | | ○ | X | ○ | ○ |
| Comparative example 36 | 1,3-propanediol (99) water (0.75) TMAH※3 (0.25) | | ○ | X | ○ | ○ |
| Example 22 | First solution PGE※2 (85) Methanesulfonic acid (15) | Second solution 1,3-butanediol (92) Water (6) TMAH※3 (2) | ○ | ◎ | ○ | ○ |
| Example 23 | First solution PGE※2 (85) Methanesulfonic acid (15) | Second solution 1,3-butanediol (99) BuDiol※4 (1) | ○ | ◎ | ○ | ○ |

TABLE 3b

| | Composition for photoresist stripping solution (wt %) | | Evaluation result | | | |
|---|---|---|---|---|---|---|
| | | | Resist stripping property※8 | damaged-layer stripping property※9 | Cu attacking property※10 | Low-k film attacking property※11 |
| Example 24 | First solution PGE※2 (85) Methanesulfonic acid (15) | Second solution 1,3-butanediol (90) Water (6) TMAH※3 (4) | ○ | ◎ | ○ | ○ |
| Example 25 | First solution PGE※2 (95) Methanesulfonic acid (5) | Second solution 1,3-butanediol (90) Water (6) TMAH※3 (4) | ○ | ◎ | ○ | ○ |
| Example 26 | First solution PGE※2 (95) Methanesulfonic acid (5) | Second solution 1,3-butanediol (90) Water (6) MP※5 (4) | ○ | ◎ | ○ | ○ |
| Example 27 | First solution PGE※2 (95) Methanesulfonic acid (5) | Second solution 1,3-butanediol (90) Water (6) PPERI※6 (4) | ○ | ◎ | ○ | ○ |
| Example 28 | First solution PGE※2 (95) Methanesulfonic acid (5) | Second solution 1,3-butanediol (90) Water (6) PPERA※7 (4) | ○ | ◎ | ○ | ○ |

※1: 1-methoxy-2-propanol,
※2: 1-ethoxy-2-propanol,
※3: tetramethylammonium hydroxide,
※4: 2-butyne-1,4-diol,
※5: morpholine,
※6: piperidine,
※7: piperazine.
※8: Resist removability: ○ good, X not removable,
※9: damaged-layer removability: ◎ good, ○ fairly good, Δ partially remained, X not removable,
※10: Cu attacking property: ○ no attack, X occurrence of corrosion,
※11: low-k film attacking property: ○ no attack, X occurrence of chemical and physical changes.

The invention claimed is:

1. A composition for photoresist stripping solution containing at least one of acetylene alcohol compounds and methanesulfonic acid, at least one of polyvalent alcohols and their derivatives, and optionally one or more fluorine compounds, wherein the concentration of the fluorine compounds is no more than 0.1 mass %.

2. The composition for photoresist stripping solution according to claim 1, further containing one or more quaternary ammonium hydroxide salts.

3. The composition for photoresist stripping solution according to claim 1, wherein the acetylene alcohol compound is 2-butyne-1,4-diol.

4. The composition for photoresist stripping solution according to claim 1, wherein the fluorine compound is ammonium fluoride.

5. The composition for photoresist stripping solution according to claim 1, wherein a water content is 10 mass % or less relative to the composition.

6. The composition for photoresist stripping solution according to claim 1, wherein the composition is used for the fabrication of semiconductor circuit devices having copper as a wiring material or a low-dielectric film as an interlayer insulating film.

7. A process of photoresist stripping, wherein the composition for photoresist stripping solution according to claim 1 is used.

8. A process of photoresist stripping comprising a treatment using a first solution which contains at least one of acetylene alcohol compounds and methanesulfonic acid, and a treatment using a second solution which contains at least one of polyvalent alcohols and their derivatives.

9. The process of photoresist stripping according to claim 8, wherein the second solution contains one or more fluorine compounds, wherein the concentration of the fluorine compounds is no more than 0.1 mass %, and one or more quaternary ammonium hydroxide salts.

10. The process of photoresist stripping according to claim 8, wherein the process is used for the fabrication of semiconductor circuit devices having copper as a wiring material or a low-dielectric film as an interlayer insulating film.

11. The composition for photoresist stripping solution according to claim 1, wherein the composition contains no fluorine compound.

* * * * *